(12) United States Patent
Werking

(10) Patent No.: US 7,893,759 B1
(45) Date of Patent: Feb. 22, 2011

(54) CURRENT CONVEYOR BASED INSTRUMENTATION AMPLIFIER

(75) Inventor: Paul M. Werking, Rockford, MN (US)

(73) Assignee: Honeywell International Inc., Morristown, NJ (US)

( * ) Notice: Subject to any disclaimer, the term of this patent is extended or adjusted under 35 U.S.C. 154(b) by 43 days.

(21) Appl. No.: 12/406,424

(22) Filed: Mar. 18, 2009

(51) Int. Cl.
  *H03F 3/45* (2006.01)
(52) U.S. Cl. ......................................................... 330/69
(58) Field of Classification Search .................. 330/69, 330/124 R, 252, 257, 258
  See application file for complete search history.

(56) References Cited

U.S. PATENT DOCUMENTS

| | | | |
|---|---|---|---|
| 4,030,043 | A | 6/1977 | Hamilton |
| 5,138,278 | A | 8/1992 | Stessen |
| 5,483,194 | A | 1/1996 | Genest |
| 6,538,503 | B2 * | 3/2003 | Burt .............................. 330/9 |
| 6,583,671 | B2 | 6/2003 | Chatwin |
| 6,710,655 | B2 | 3/2004 | Parkhurst et al. |
| 7,215,197 | B2 | 5/2007 | Regier |
| 2002/0101285 | A1 | 8/2002 | Chatwin |
| 2003/0201791 | A1 | 10/2003 | Andrys et al. |
| 2004/0125678 | A1 | 7/2004 | Sinha et al. |
| 2006/0038614 | A1 | 2/2006 | Regier |
| 2007/0057721 | A1 | 3/2007 | Risbo et al. |

FOREIGN PATENT DOCUMENTS

KR   2003 0053492   6/2003

OTHER PUBLICATIONS

Tadic et al,, "Optical Receiver With Widely Tunable Sensitivity in BiCMOS Technology," IEEE Transactions on Circuits and Systems—I: Regular Papers, vol. 55, No. 5, pp. 1223-1236, Jun. 2008.

Babaei et al, "High CMRR and Low THD Current-Mode Instrumentation Amplifier Using Current Inversion Technique," Norchip, IEEE, 4 pages, 2007.

Ghallab et al., "A Novel Current-Mode Instrumentation Amplifier Based on Operational Floating Current Conveyor," IEEE Transactions on Instrumentation and Measurement, vol. 54, No. 5, pp. 1941-1949, Oct. 2005.

Gift, "An Enhanced Current-Mode Instrumentation Amplifier," IEEE Transactions on Instrumentation and Measurement, vol. 5, No. 1, pp. 85-88, Feb. 2001.

European Search Report from corresponding EP Application No. 10150384.5-2215, 4 pages, mailed Mar. 31, 2010.

C. Toumazou and F.J. Lidgey, "Novel Current-Mode Instrumentation Amplifier", Electronics Letters, Feb. 2, 1989, vol. 25 No. 3.

B. Wilson, "Universal Conveyor Instrumentation Amplifier", Electronics Letters, Mar. 30, 1989, vol. 25 No. 7.

Examination Report from corresponding EP Application No. 10 150 384.5, mailed Apr. 13, 2010, 4 pages.

* cited by examiner

*Primary Examiner*—Robert Pascal
*Assistant Examiner*—Khiem D Nguyen
(74) *Attorney, Agent, or Firm*—Shumaker & Sieffert, P.A.

(57) ABSTRACT

Current conveyor based instrumentation amplifiers are disclosed. Such instrumentation amplifiers may have the higher common mode rejection ratios (CMRR), lower area requirements in integrated circuits, fewer resistors, fewer resistor matching requirements, less noise, and less distortion than prior art instrumentation amplifiers. One embodiment, with two input voltage lines and one output voltage line, comprises a single current conveyor and two resistors. Another embodiment, with two input voltage lines and two output voltage lines, comprises two current conveyors and four resistors, possibly in two matched pairs. Buffers may be used for impedance, frequency, and phase delay adjustment on any or all of the voltage lines.

21 Claims, 2 Drawing Sheets

CURRENT CONVEYOR BASED INSTRUMENTATION AMPLIFIER

STATEMENT REGARDING FEDERALLY SPONSORED RESEARCH OR DEVELOPMENT

The United States Government has acquired certain rights in this invention pursuant to Contract No. FA8650-05-C-5707 with the Air Force Research Laboratory.

FIELD OF THE INVENTION

The embodiments herein relate to integrated circuits, particularly to instrumentation amplifiers in integrated circuits.

BACKGROUND

Many applications—laboratory, industrial, and audio applications being some examples—share the need to measure the difference between two relatively weak voltages on which there is a common voltage superimposed. Instrumentation amplifiers fill this need by rejecting the superimposed voltage, or common mode voltage, on two input voltages and generating an output voltage that is directly proportional to the difference between the two input voltages. Thus, the output voltage, $V_{OUT}$, of an instrumentation amplifier is characterized by the operation of a common mode gain, $A_{CM}$, and a differential gain, $A_{DM}$, on the two input voltages, $V_1$ and $V_2$, according to the equation:

$$V_{OUT} = A_{DM}(V_1 - V_2) + A_{CM}(V_1 + V_2)/2$$

An ideal instrumentation amplifier has a constant differential gain and a common mode gain of zero. In practice, the common mode gain may not be zero but instead may be much less than the differential gain. An important measurement for instrumentation amplifiers is the common mode rejection ratio (CMRR), which is a ratio of the common mode gain to the differential gain expressed in decibels. Typical instrumentation amplifiers may have CMRR in the range of 30 to 60 dB, with higher CMRR being desirable.

Typical instrumentation amplifiers are implemented using operational amplifiers and four or more resistors. The magnitude of resistance presented by particular resistors in the instrumentation amplifier dictates the gain of the amplifier. However, controlling the gain of these amplifiers through resistor selection is typically contingent upon matching paired resistors. Fabrication may be difficult because of the constraint of precisely matching resistor pairs. For example, discrepancies between resistors may be alleviated through the expensive process of resistor trimming.

Resistors in instrumentation amplifiers may pose additional complications. For instance, resistors, such as polysilicon resistors, may have voltage coefficients that create significant distortion or non-linearity in the output voltage, even when resistor pairs match perfectly. Such voltage coefficients will allow any common mode voltage to effectively modulate the output voltage by changing the differential gain.

SUMMARY

In one embodiment, an amplifier using a single current conveyor is disclosed. The current conveyor has an input y, an input x, and an output z, and the current at input x is related to the current at output z by a current gain. Further, the voltage at input x is substantially equal to voltage at input y. A first input voltage line is connected to input y of the current conveyor, and a second input voltage line is connected to input x of the current conveyor through a first resistive element. A second resistive element connects output z of the current conveyor to ground. Additionally, an output voltage line is connected to output z of the current conveyor.

In another embodiment, an amplifier using two current conveyors is disclosed. The first current conveyor has a first input y, a first input x, and a first output z, and the current at first input x is related to the current at first output z by a first current gain. Additionally, the voltage at first input x is substantially equal to the voltage at first input y. Similarly, the second current conveyor has a second input y, a second input x, and a second output z, and the current at second input x is related to the current at second output z by a second current gain. Again, the voltage at second input x is substantially equal to the voltage at second input y.

This embodiment contains two input voltage lines and two output voltage lines. The first input voltage line is connected to first input y of the first current conveyor, and the second input voltage line is connected to second input y. Further, the second input voltage line is connected to first input x of the first current conveyor through a first resistive element. A second resistive element connects the first output z of the first current conveyor to ground, and a third resistive element connects the first input voltage line to the second input x. The first output voltage line is connected to first output z of the first current conveyor, and the second output voltage line connected to the second output z of the second current conveyor. Additionally, a fourth resistive element connects the second output z of the second current conveyor to ground.

Further embodiments include the above amplifiers having buffers on some or all of the input and output voltage lines. These buffers may comprise operational amplifiers and may apply voltage gains and phase delay responses to those voltage lines. The voltage gains may be matched across the input buffers and may equal unity. Additionally, the phase delay response may be matched across the input buffers.

These as well as other features and advantages will become apparent to those of ordinary skill in the art by reading the following detailed description, with appropriate reference to the accompanying drawings.

DETAILED DESCRIPTION OF THE DRAWINGS

A current conveyor is a circuit component with two input terminals and one output terminal. The voltage at the two input terminals is equal, and the current at the output terminal is proportional to that of one of the input terminals, by a factor of a current gain. In a current conveyor with a current gain of unity, the current at the output terminal is equal to the current at the appropriate input terminal.

Figure 1:
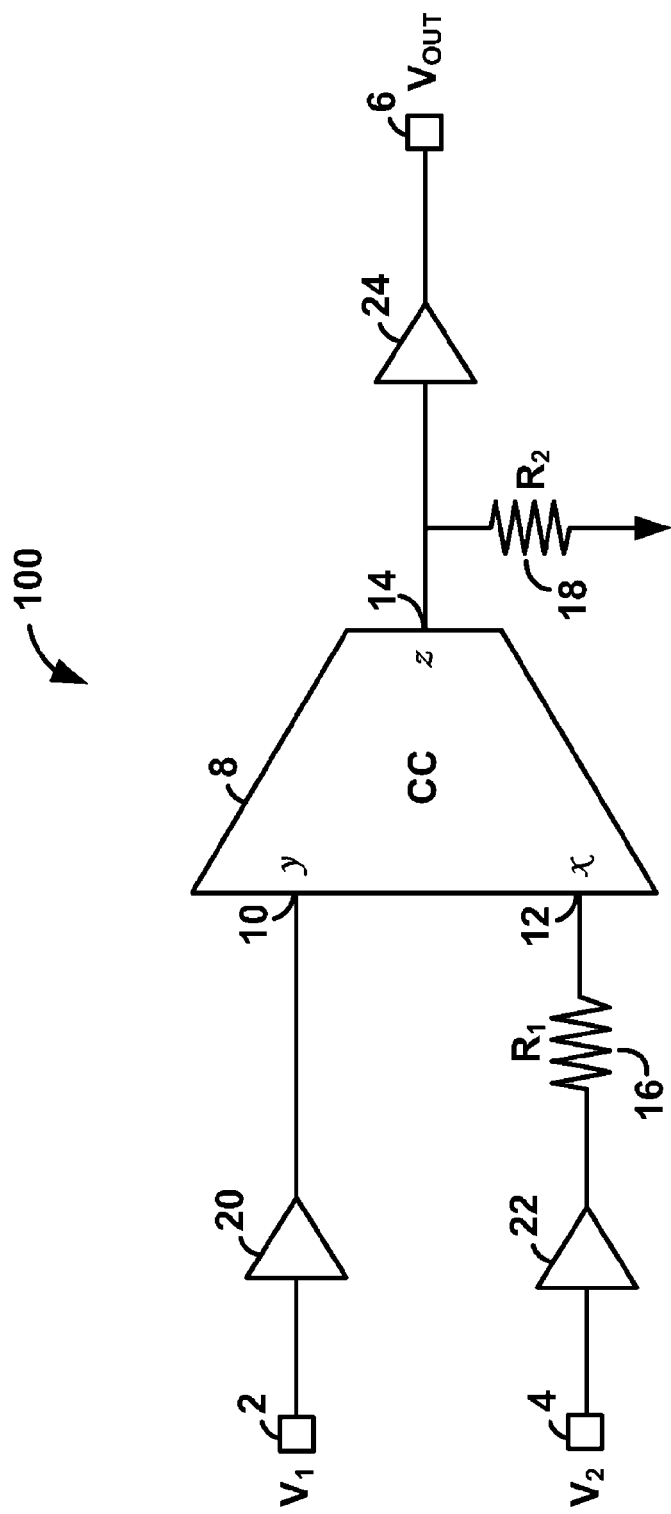
FIG. 1 is a circuit diagram showing an instrumentation amplifier implemented with a single current conveyor, according to an embodiment of the invention.

FIG. 1 is a circuit diagram showing an instrumentation amplifier 100 implemented with a single current conveyor 8, according to an embodiment of the invention. In a preferred embodiment, current conveyor 8 is a type 2 current conveyor (CCII). Current conveyor 8 has an x input 12, a y input 10, and a z output 14. As discussed above, the voltage at input terminals 10 and 12 is equal, and the current at output terminal 14 is proportional to that of input terminal 12, by a factor of a current gain. In a preferred embodiment, the current gain may be unity.

This embodiment comprises two input voltage lines, input voltage line 2 carrying voltage $V_1$ and input voltage line 4 carrying voltage $V_2$, and one output voltage line 6 carrying voltage $V_{OUT}$. Input line 2 may be connected directly to input terminal 10 of current conveyor 8, or may connect through buffer 20, as shown in FIG. 1. Input line 4 connects to input terminal 12 through a resistor 16 having resistance $R_1$. Input line 4 may also connect through buffer 22 and resistor 16, as shown in FIG. 1. Output terminal 14 connects to output line 6 and may be connected through buffer 24, as shown in FIG. 1. A resistor 18 having resistance $R_2$ connects output terminal 14 to ground.

Buffers 20, 22, and 24 may be disposed as shown in FIG. 1 to shift the operational frequency range of amplifier 100, or to adjust the impedance or phase delay response of the respective voltage lines, according to the needs and characteristics of the circuit in which instrumentation amplifier 100 sits. Alternatively, any or all of buffers 20, 22, and 24 may be absent from instrumentation amplifier 100.

For example, buffer 22 may be present in instrumentation amplifier 100 in order to equalize the impedance on input voltage line 4 to that of input voltage line 2. As another example, each buffer may be an operational amplifier with a non-inverting input, an inverting input, and an output, where the output is fed back to the inverting input, and having a voltage gain of unity.

Additionally, buffers having gains greater than unity may be used to reduce noise at the cost of lower CMRR. Further, in an embodiment having two input buffers, those two buffers may be configured to equalize the phase delay response of the two input voltage lines, or the two buffers may have matched voltage gains. Each buffer may also be implemented using a single transistor circuit, such as a source-follower amplifier or an emitter-follower amplifier. Any other suitable buffer or buffer configuration may be used; indeed, a current conveyor may be configured as an appropriate buffer.

Resistors 16 and 18 may be discrete resistive elements. As an exemplary but not limiting list of possible materials, resistors 16 and 18 may be polysilicon resistors, TaN resistors, CrSi resistors, CrSiN resistors, or SiCCr resistors.

By inspection and using the characteristics of current conveyors described above, the differential gain of instrumentation amplifier 100 may be calculated as follows:

$$A_{DM}=V_{OUT}/(V_1-V_2)=R_2/R_1$$

Therefore, the resistances of resistors 16 and 18 determine the differential gain of instrumentation amplifier 100, and that differential gain is not contingent upon matching any other pairs of resistors in the circuit. The common mode gain of instrumentation amplifier 100 is essentially the common mode gain of current conveyor 8, which is a function of the current conveyor's internal architecture in the same way as it would be for an operational amplifier. Therefore, the CMRR of instrumentation amplifier 100 is limited only by the CMRR of current conveyor 8. Typically, the CMRR of the amplifier is 80 dB to 120 dB or even higher, just like an operational amplifier and presents a significant advantage over prior art instrumentation amplifiers.

Instrumentation amplifier 100 may present additional advantages. For instance, common mode voltages will not cause unwanted modulation of the voltage on output line 6 when polysilicon resistors are used for R1 and R2, regardless of the differential gain. Further, a differential gain of unity may eliminate distortion in the circuit, even when resistors 16 and 18 are polysilicon resistors. Moreover, the instrumentation amplifier shown in FIG. 1 may have a reduced cost over prior art instrumentation amplifiers because of reduced semiconductor area requirements and may require less supply current. The absence of a resistor trim requirement for high CMMR may yield additional cost savings.

Figure 2:
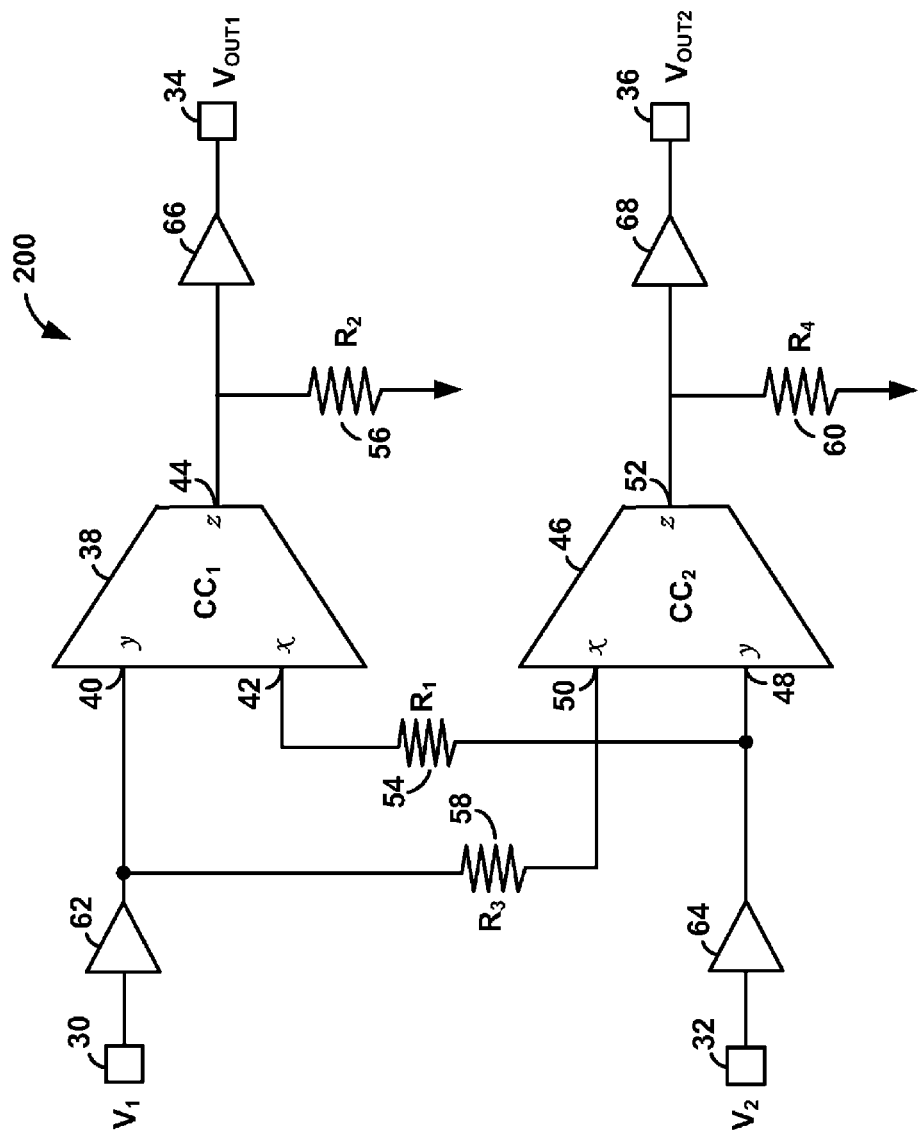
FIG. 2 is a circuit diagram showing an instrumentation amplifier implemented with two current conveyors, according to another embodiment of the invention.

FIG. 2 is a circuit diagram showing a differential output instrumentation amplifier 200, implemented with two current conveyors 38 and 46, according to another embodiment of the invention. In a preferred embodiment, current conveyors 38 and 46 are type 2 current conveyors (CCIIs). Current conveyor 38 has an x input 42, a y input 40, and a z output 44. As discussed above, the voltage at input terminals 40 and 42 is equal, and the current at output terminal 44 is proportional to that of input terminal 42, by a factor of a first current gain. Current conveyor 46 has an x input 50, a y input 48, and a z output 52. Again, the voltage at input terminals 50 and 48 is equal, and the current at output terminal 52 is proportional to that of input terminal 50, by a factor of a second current gain. In a preferred embodiment, the first and second current gains may each be unity.

This embodiment comprises two input voltage lines, input voltage line 30 carrying voltage $V_1$ and input voltage line 32 carrying voltage $V_2$. Input line 30 may be connected directly to input terminal 40 of current conveyor 38, or may connect through buffer 62, as shown in FIG. 2. Input line 32 connects to input terminal 42 through a resistor 54 having resistance $R_1$. A buffer 64 may be inserted before resistor 54 on input line 32. Input line 30 connects to input terminal 50 through a resistor 58 having resistance $R_3$, and buffer 62 may or may not be inserted upstream of resistor 58. Finally, input line 32 may be connected directly to input terminal 48 of current conveyor 46, or may connect through buffer 64, as shown in FIG. 2.

Instrumentation amplifier 200 may also include two output voltage lines, output voltage line 34 carrying voltage $V_{OUT1}$ and output voltage line 36 carrying voltage $V_{OUT2}$. Output terminal 44 connects to output line 34 and may be connected through buffer 66, as shown in FIG. 2. A resistor 56 having resistance $R_2$ connects output terminal 44 to ground. Further, output terminal 52 connects to output line 36 and may be connected through buffer 68, as shown in FIG. 2. A resistor 60 having resistance $R_4$ connects output terminal 52 to ground.

Similarly to the optional buffers of instrumentation amplifier 100, buffers 62, 64, 66, and 68 may be disposed as shown in FIG. 2 to shift the operational frequency range of amplifier 200, or to adjust the impedance or phase delay response of the respective voltage lines, according to the needs and characteristics of the circuit in which instrumentation amplifier 200 sits. Alternatively, any or all of buffers 62, 64, 66, and 68 may be absent from instrumentation amplifier 200.

As an example of possible buffer configurations, each buffer may be an operational amplifier with a non-inverting input, an inverting input, and an output, where the output is fed back to the inverting input, and having a voltage gain of unity. Additionally, buffers having non-unity gains may be used. Further, in an embodiment having two input buffers, those two buffers may be configured to equalize the phase delay response of the two input voltage lines, or the two buffers may have matched voltage gains. Each buffer may also be implemented using a single transistor circuit, such as a source-follower amplifier or an emitter-follower amplifier. Any other suitable buffer, combination of buffers, or buffer configuration may be used; indeed, a current conveyor may be configured as an appropriate buffer.

Resistors 54, 56, 58, and 60 may be discrete resistive elements. As an exemplary but not limiting list of possible materials, resistors 54, 56, 58, and 60 may be polysilicon resistors, TaN resistors, CrSi resistors, CrSiN resistors, or SiCCr resistors.

By inspection and using the characteristics of current conveyors described above, the differential gain of instrumentation amplifier 200 may be calculated as follows:

$$A_{DM} = (V_{OUT1} - V_{OUT2})/(V_1 - V_2) = (R_2/R_1) + (R_4/R_3)$$

The resistances of resistor 54 and resistor 58 may be matched at $R_1$, and the resistances of resistor 56 and resistor 60 may be matched at $R_2$, so that the formula for differential gain simplifies to:

$$A_{DM} = 2(R_2/R_1)$$

The common-mode gain of each current conveyor in this circuit depends on its internal architecture and is the same as for the current conveyor shown in FIG. 1; −80 to −120 dB or lower. Since current conveyor 38 has a positive common-mode gain and current conveyor 46 has a negative common-mode gain, it is possible for this circuit to produce a differential output ($V_{OUT1} - V_{OUT2}$) that is a function of the common-mode input voltage ½ ($V_1 + V_2$). However, if both current conveyors are of the same design, this unwanted differential output will have twice the amplitude of each current conveyor's output. In other words, the magnitude of this common-mode input to differential-mode output conversion will be 6 dB greater than the common-mode response of each current conveyor: −74 to −114 dB or lower.

Therefore, the resistances of resistors 54, 56, 58, and 60 determine the differential gain of instrumentation amplifier 200. The CMRR of amplifier 200 may be 74 to 114 dB or more without trim. This presents a significant advantage over prior art differential output instrumentation amplifiers.

Instrumentation amplifier 200 may present additional advantages. For instance, instrumentation amplifier 200 may have particularly low noise. Further, instrumentation amplifier 200 may have high bandwidth, relative to conventional instrumentation amplifiers implemented using operational amplifiers. Additionally, like instrumentation amplifier 100, this amplifier may have lower trim costs and reduce distortion when used with polysilicon resistors.

It should be understood that this and other arrangements and amplifiers described herein are set forth for purposes of example only, and other arrangements and elements (e.g., machines, interfaces, functions, and orders of elements) can be added or used instead and some elements may be omitted altogether. Further, as in most circuits, those skilled in the art will appreciate that many of the elements described herein are functional entities that may be implemented as discrete components or in conjunction with other components, in any suitable combination and location.

What is claimed is:

1. An amplifier comprising:
   a current conveyor having an input y, an input x, and an output z, wherein current at input x is related to current at output z by a current gain, and wherein voltage at input x is substantially equal to voltage at input y;
   a first input voltage line connected to input y of the current conveyor;
   a second input voltage line connected to input x of the current conveyor through a first resistive element;
   a second resistive element connecting output z of the current conveyor to ground;
   an output voltage line connected to output z of the current conveyor;
   a first input buffer having a non-inverting input and an output, wherein the second input voltage line is connected to the non-inverting input of the first input buffer, wherein the output of the first input buffer is connected to input x of the current conveyor through the first resistive element, and wherein the first input buffer has a first voltage gain; and
   a second input buffer having a non-inverting input and an output, wherein the first input voltage line is connected to the non-inverting input of the second input buffer, wherein the output of the second input buffer is connected to input y of the current conveyor, and wherein the second input buffer has a second voltage gain.

2. The amplifier of claim 1, wherein the first voltage gain is equal to the second voltage gain.

3. The amplifier of claim 2, wherein the first voltage gain is unity and the second voltage gain is unity.

4. The amplifier of claim 1, wherein the first input buffer has a phase delay response equal to a phase delay response of the second input buffer.

5. The amplifier of claim 1, wherein the first input buffer and the second input buffer comprise operational amplifiers.

6. The amplifier of claim 1, wherein voltage relationships between the first and the second input voltage lines and the output voltage line are characterized by a common mode gain and a differential mode gain, wherein a common mode rejection ratio (CMRR) is a ratio of the differential mode gain to the common mode gain, and wherein the CMRR is at least 60 dB.

7. The amplifier of claim 1, wherein the first resistive element and the second resistive element each comprises a discrete resistive element and wherein the first resistive element is not matched to the second resistive element.

8. The amplifier of claim 1, further comprising an output buffer having a non-inverting input and an output, wherein the output z of the current conveyor is connected to the non-inverting input of the output buffer, wherein the output of the output buffer is connected to the output voltage line, and wherein the output buffer has an output buffer voltage gain.

9. The amplifier of claim 8, wherein the output buffer comprises an operational amplifier and the output buffer voltage gain is unity.

10. An amplifier comprising:
    a first current conveyor having a first input y, a first input x, and a first output z, wherein current at first input x is related to current at first output z by a first current gain, and wherein voltage at first input x is substantially equal to voltage at first input y;
    a first input voltage line connected to first input y of the first current conveyor;
    a second input voltage line connected to first input x of the first current conveyor through a first resistive element;
    a second resistive element connecting the first output z of the first current conveyor to ground;
    a first output voltage line connected to first output z of the first current conveyor;
    a second current conveyor having a second input y, a second input x, and a second output z, wherein current at second input x is related to current at second output z by a second current gain, wherein voltage at second input x is substantially equal to voltage at second input y, wherein the second input voltage line is connected to second input y, and wherein a third resistive element connects the first input voltage line to the second input x;
    a second output voltage line connected to the second output z of the second current conveyor; and a fourth resistive element connecting the second output z of the second current conveyor to ground.

11. The amplifier of claim 10, wherein the first current gain is equal to the second current gain.

12. The amplifier of claim 10, wherein voltage relationships between the two input voltage lines and the two output voltage lines are characterized by a common mode gain and a differential mode gain, wherein a common mode rejection ratio (CMRR) is a ratio of the differential mode gain to the common mode gain, and wherein the CMRR is at least 60 dB.

13. The amplifier of claim 10, wherein the second resistive element is matched to the fourth resistive element.

14. The amplifier of claim 10, further comprising
a first input buffer having an input and an output, wherein the first input voltage line is connected to the input, wherein the output is connected to input y of the first current conveyor, and wherein the first input buffer has a first input voltage gain; and
a second input buffer having an input and an output, wherein the second input voltage line is connected to the input, wherein the output is connected to the first input x of the first current conveyor through the first resistive element, and wherein the second input buffer has a second input voltage gain.

15. The amplifier of claim 14, wherein the first voltage gain is equal to the second voltage gain.

16. The amplifier of claim 14, wherein the first input buffer has a phase delay response equal to a phase delay response of the second input buffer.

17. The amplifier of claim 14, wherein the first input buffer and the second input buffer comprise operational amplifiers.

18. The amplifier of claim 14, further comprising
a first output buffer having a non-inverting input and an output, wherein the first output z of the first current conveyor is connected to the non-inverting input, wherein the output is connected to the first output voltage line, and wherein the first output buffer has a first output voltage gain; and
a second output buffer having a non-inverting input and an output, wherein the second output z of the second current conveyor is connected to the non-inverting input, wherein the output is connected to the second output voltage line, and wherein the second output buffer has a second output voltage gain.

19. The amplifier of claim 18, wherein the first output voltage gain is equal to the second output voltage gain.

20. The amplifier of claim 18, wherein the first output buffer and the second output buffer comprise operational amplifiers.

21. An amplifier comprising:
a current conveyor having an input y, an input x, and an output z, wherein current at input x is related to current at output z by a current gain of one, and wherein voltage at input x is substantially equal to voltage at input y;
a first input buffer having a non-inverting input and an output, wherein the output is connected to input y of the current conveyor, and wherein the first input buffer has a unity voltage gain;
a first input voltage line connected to the non-inverting input of the first input buffer;
a second input buffer having a non-inverting input and an output, wherein the output is connected to input x of the current conveyor through a first discrete resistive element, and wherein the second input buffer has a unity voltage gain;
a second input voltage line connected to the non-inverting input of the second input buffer;
a second discrete resistive element connecting output z of the current conveyor to ground;
an output buffer having a non-inverting input and an output, wherein the non-inverting input is connected to output z of the current conveyor, wherein the output is connected to an output voltage line, and where the output buffer has a unity voltage gain.

* * * * *